(12) United States Patent
Ramm et al.

(10) Patent No.: US 11,814,702 B2
(45) Date of Patent: Nov. 14, 2023

(54) PVD BOND COAT

(71) Applicant: Oerlikon Surface Solutions AG, Pfaffikon, Pfaffikon (CH)

(72) Inventors: Jurgen Ramm, Maienfeld (CH); Beno Widrig, Bad Ragaz (CH); Peter Polcik, Reutte (AT); Malko Gindrat, Wohlen (CH)

(73) Assignee: OERLIKON SURFACE SOLUTIONS AG, PFAFFIKON, Pfaffikon (CH)

( * ) Notice: Subject to any disclaimer, the term of this patent is extended or adjusted under 35 U.S.C. 154(b) by 420 days.

(21) Appl. No.: 16/606,428

(22) PCT Filed: Apr. 19, 2018

(86) PCT No.: PCT/EP2018/060045
§ 371 (c)(1),
(2) Date: Oct. 18, 2019

(87) PCT Pub. No.: WO2018/193035
PCT Pub. Date: Oct. 25, 2018

(65) Prior Publication Data
US 2020/0165718 A1 May 28, 2020

(30) Foreign Application Priority Data

Apr. 21, 2017 (CH) .................................. 00534/17

(51) Int. Cl.
*C23C 14/32* (2006.01)
*C23C 14/00* (2006.01)
(Continued)

(52) U.S. Cl.
CPC ............ *C22C 1/0433* (2013.01); *B22F 3/087* (2013.01); *B22F 3/105* (2013.01); *B22F 5/04* (2013.01);
(Continued)

(58) Field of Classification Search
CPC . C22C 2200/00; C22C 1/0433; C22C 1/0416; C22C 1/0491; C22C 1/0458;
(Continued)

(56) References Cited

U.S. PATENT DOCUMENTS 6,183,888 B1 2/2001 Alperine et al.
7,740,948 B1 6/2010 Alvin
(Continued)

FOREIGN PATENT DOCUMENTS

CA 2573585 A1 8/2007
EP 0 718 420 B1 6/1996
(Continued)

OTHER PUBLICATIONS

Couret, et al., "Microstructures and Mechanical Properties of TiAl Alloys Consolidated by Spark Plasma Sintering", Intermetallics, Elsevier Science Publishers B.V., GB, vol. 16, No. 9, Sep. 1, 2008, pp. 1134-1141.
(Continued)

*Primary Examiner* — Michael E. La Villa
(74) *Attorney, Agent, or Firm* — Pearne & Gordon LLP

(57) ABSTRACT

A superalloy workpiece includes a superalloy substrate and an interface layer (IF-1) of essentially the same superalloy composition directly on a surface of the superalloy substrate. A transition layer (TL) of essentially the same superalloy and superalloy oxides or a different metal composition and different metal oxides is on the interface layer (IF-1). The oxygen content of the transition layer increases from the interface layer (IF-1) towards a barrier layer (IF-2) of super alloy oxides or of different metal oxides.

17 Claims, 6 Drawing Sheets

Example

(51) Int. Cl.

| | |
|---|---|
| C23C 14/02 | (2006.01) |
| C23C 14/16 | (2006.01) |
| C23C 28/00 | (2006.01) |
| B22F 5/04 | (2006.01) |
| C22C 1/04 | (2023.01) |
| B22F 3/105 | (2006.01) |
| B22F 9/04 | (2006.01) |
| C23C 14/34 | (2006.01) |
| B22F 3/087 | (2006.01) |
| C22C 19/07 | (2006.01) |
| C23C 28/02 | (2006.01) |
| C23C 28/04 | (2006.01) |
| C23C 30/00 | (2006.01) |
| C23C 14/08 | (2006.01) |
| C23C 14/14 | (2006.01) |
| F01D 5/28 | (2006.01) |
| B32B 15/01 | (2006.01) |
| F01D 25/00 | (2006.01) |
| C22C 19/03 | (2006.01) |
| C22C 1/047 | (2023.01) |

(52) U.S. Cl.
CPC .............. *B22F 9/04* (2013.01); *B32B 15/01* (2013.01); *C22C 1/047* (2023.01); *C22C 1/0416* (2013.01); *C22C 19/03* (2013.01); *C22C 19/07* (2013.01); *C23C 14/0021* (2013.01); *C23C 14/0036* (2013.01); *C23C 14/025* (2013.01); *C23C 14/027* (2013.01); *C23C 14/08* (2013.01); *C23C 14/081* (2013.01); *C23C 14/083* (2013.01); *C23C 14/085* (2013.01); *C23C 14/14* (2013.01); *C23C 14/16* (2013.01); *C23C 14/325* (2013.01); *C23C 14/3414* (2013.01); *C23C 28/02* (2013.01); *C23C 28/022* (2013.01); *C23C 28/028* (2013.01); *C23C 28/048* (2013.01); *C23C 28/30* (2013.01); *C23C 28/321* (2013.01); *C23C 28/325* (2013.01); *C23C 28/345* (2013.01); *C23C 28/36* (2013.01); *C23C 30/00* (2013.01); *C23C 30/005* (2013.01); *F01D 5/28* (2013.01); *F01D 5/284* (2013.01); *F01D 5/288* (2013.01); *F01D 25/005* (2013.01); *B22F 2003/1051* (2013.01); *C22C 1/0458* (2013.01); *C22C 2200/00* (2013.01); *F05D 2220/30* (2013.01); *F05D 2220/32* (2013.01); *F05D 2230/30* (2013.01); *F05D 2230/90* (2013.01); *F05D 2300/175* (2013.01); *F05D 2300/21* (2013.01); *F05D 2300/611* (2013.01); *Y10T 428/1259* (2015.01); *Y10T 428/12458* (2015.01); *Y10T 428/12597* (2015.01); *Y10T 428/12604* (2015.01); *Y10T 428/12611* (2015.01); *Y10T 428/12639* (2015.01); *Y10T 428/12667* (2015.01); *Y10T 428/12771* (2015.01)

(58) Field of Classification Search
CPC ......... C22C 19/03; C22C 19/07; C22C 19/05; C22C 19/051; C22C 19/052; C22C 19/058; C22C 19/053; C22C 19/055; C22C 19/056; C22C 1/047; B22F 3/087; B22F 3/105; B22F 5/04; B22F 9/04; B22F 2003/1051; C23C 14/0021; C23C 14/027; C23C 14/16; C23C 14/325; C23C 14/3414; C23C 14/0036; C23C 14/025; C23C 14/08; C23C 14/081; C23C 14/083; C23C 14/085; C23C 14/14; C23C 28/321; C23C 28/325; C23C 28/345; C23C 28/36; C23C 28/02; C23C 28/021; C23C 28/022; C23C 28/028; C23C 28/048; C23C 28/30; C23C 30/00; C23C 30/005; Y10T 428/12458; Y10T 428/12639; Y10T 428/12667; Y10T 428/12771; Y10T 428/1259; Y10T 428/12646; Y10T 428/12597; Y10T 428/12611; Y10T 428/12604; Y10T 428/12618; Y10T 428/1266; Y10T 428/12931; Y10T 428/12944; Y10T 428/12951; Y10T 428/12958; Y10T 428/12993; Y10T 428/12979; B32B 15/01; B32B 15/00; B32B 15/04; B32B 15/043; B32B 15/18; B32B 15/20; F01D 5/28; F01D 5/288; F01D 5/284; F01D 25/005; F05D 2220/30; F05D 2220/32; F05D 2230/30; F05D 2230/90; F05D 2300/175; F05D 2300/21; F05D 2300/611

See application file for complete search history.

(56) References Cited

U.S. PATENT DOCUMENTS

| | | | |
|---|---|---|---|
| 2008/0199709 | A1 | 8/2008 | Ishiwata et al. |
| 2011/0217560 | A1* | 9/2011 | Ridgeway ............... C23C 30/00 427/248.1 |
| 2012/0122651 | A1* | 5/2012 | Taylor ...................... C23C 4/18 501/103 |
| 2012/0244383 | A1* | 9/2012 | Meschter ............. C23C 28/042 428/428 |
| 2013/0122317 | A1 | 5/2013 | Cheruvu |
| 2013/0213802 | A1 | 8/2013 | Sato |
| 2013/0233705 | A1 | 9/2013 | O'Sullivan |
| 2014/0014639 | A1 | 1/2014 | Couret |
| 2015/0030871 | A1* | 1/2015 | Bruck ................. C23C 28/3455 428/547 |

FOREIGN PATENT DOCUMENTS

| | | | |
|---|---|---|---|
| EP | 1 652 960 | A1 | 5/2006 |
| EP | 1760771 | A1 | 3/2007 |
| EP | 1944387 | A1 | 7/2008 |
| EP | 2 804 711 | B1 | 11/2014 |
| EP | 2 918 705 | A1 | 9/2015 |
| EP | 2980267 | A2 | 2/2016 |
| JP | 2007217795 | A | 8/2007 |
| JP | 2008202092 | A | 9/2008 |
| JP | 2011224768 | A | 11/2011 |
| JP | 2015-155573 | A | 8/2015 |
| JP | 2016036873 | A | 3/2016 |
| RU | 2405062 | C2 | 11/2010 |
| RU | 2561624 | C2 | 8/2015 |
| RU | 2 562 552 | C1 | 9/2015 |
| WO | 2011009573 | A1 | 1/2011 |
| WO | 2011111264 | A1 | 9/2011 |
| WO | 2015/089533 | A1 | 6/2015 |
| WO | 2017/044042 | A1 | 3/2017 |
| WO | 2018193035 | A1 | 10/2018 |

OTHER PUBLICATIONS

Guillon, et al., "Field-Assisted Sintering Technology/Spark Plasma Sintering: Mechanisms, Materials, and Technology Developments", Advanced Engineering Materials, vol. 16, No. 7, Apr. 30, 2014, pp. 830-849.

Grazulis, et al., "Crystallography Open Database—an open-access collection of crystal structures", Journal of Applied Crystallography, May 4, 2009, pp. 726-729, vol. 42.

Ast, et al. "Synthesis and characterization of superalloy coatings by cathodic arc evaporation", Surface & Coatings Technology, Aug. 4, 2017, pp. 139-145, vol. 327.

(56) References Cited

OTHER PUBLICATIONS

International Search Report for PCT/EP2018/060045 dated Aug. 1, 2018.
Written Opinion for PCT/EP2018/060045 dated Aug. 1, 2018.
"Lecture 21: Types of Interfaces: coherent, semi-coherent, and incoherent," from website: https://my.eng.utah.edu/~lzang/images/lecture-21.pdf (last visited Jul. 12, 2022).
"Coherent Interface—an overview," ScienceDirect Topics, (citing Section 10.2 of "Surfaces, Grain Boundaries and Interfaces," R.E. Smallman, A.H.V. Ngan, Modern Physical Metallurgy (Eighth Edition), 2014) from website: https://www.sciencedirect.com/topics/engineering/coherent-interface (last visited Jul. 12, 2022).
Warnken, Nils, "Studies on the Solidification Path of Single Crystal Superalloys", Journal of Phase Equilibria and Diffusion, Jan. 26, 2016, pp. 100-107, vol. 37, No. 1.

* cited by examiner

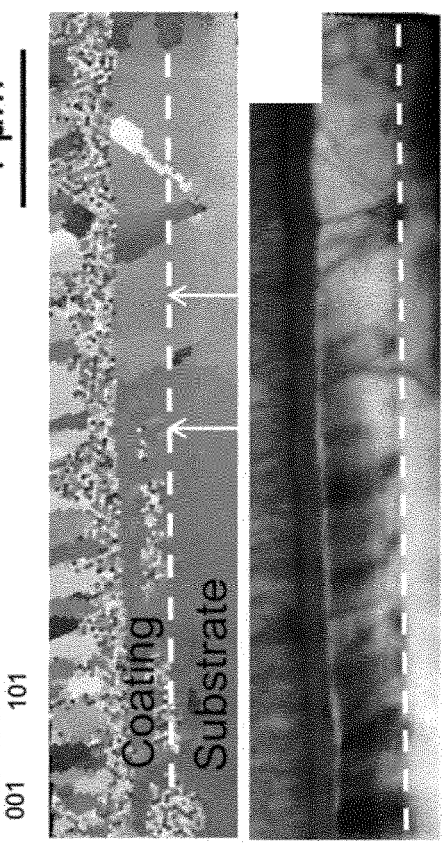
FIG. 8B
FIG. 8C
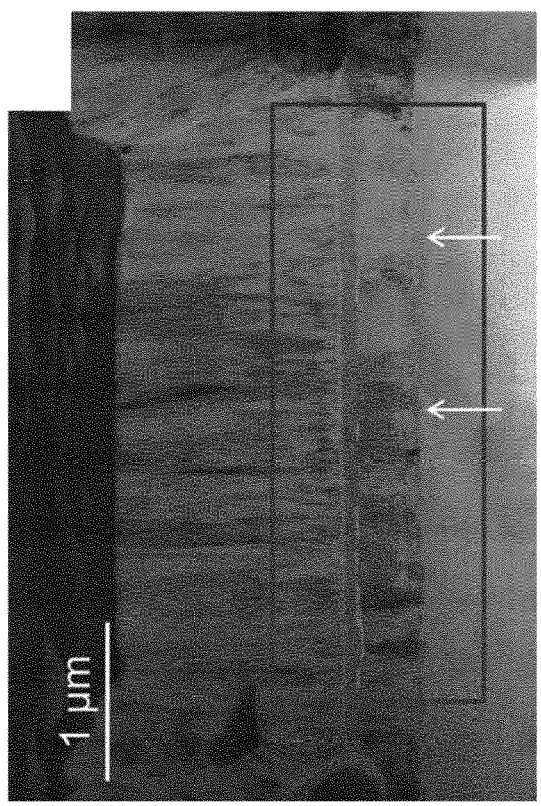
FIG. 8A

PVD BOND COAT

TECHNICAL FIELD

The invention refers to the field of coated superalloy (SA) materials, in particular to a coating method, a workpiece and a method to manufacture a workpiece according to the claims.

TECHNICAL BACKGROUND

Super alloys exhibit several key characteristics: excellent mechanical strength, resistance to thermal creep deformation, good surface stability, and resistance to corrosion or oxidation. The crystal structure is typically face-centered cubic austenitic. Examples of such alloys are Hastelloy, Inconel, Waspaloy, Rene alloys, Haynes alloys, Incoloy, MP98T, TMS alloys, and CMSX single crystal alloys. Superalloys develop high temperature strength through solid solution strengthening. An important strengthening mechanism is precipitation strengthening which forms secondary phase precipitates such as gamma prime and carbides. Oxidation or corrosion resistance is provided by elements such as aluminum and chromium. Basically there are two types of superalloys one are Co-based superalloys with cobalt as the main metallic component and e.g. C, Cr, W, Ni, Ti, Al, Ir, and Ta as alloying element, the other one and until today the most important class are Ni-based superalloys with Nickel as the main metallic component and e.g. Cr, Fe, Co, Mo, W, Ta, Al, Ti, Zr, Nb, Re, Y, V, C, B, or Hf as only some examples of the alloying additions used with this superalloy group. One focus of the present invention is it to improve thermal and wear properties of superalloys in general and especially for applications such as high and low-pressure turbine components for aero and industrial gas turbine (IGT) applications whereby several successful experiments have been made with Ni-based superalloys such as PWA 1483 and CM 247-DS. Further on aluminide-based alloys as TiAl-based superalloys like γ-TiAl or further aluminides forming high temperature and high wear resistant alloys comprising: Ni-Aluminide as NiAl also known as Raney Nickel or as $NiAl_3$, Fe-Aluminide, Hf-Aluminide, Cr-Aluminide, Nb-Aluminide, e.g. $Nb_3Al$ or $NbAl_3$, Ta-Aluminide, e.g. $Ta_3Al$ or $TaAl_3$, Pt-Aluminide, Zr-Aluminide and the like are hereby understood as superalloy compositions.

Spark plasma sintering (SPS) is a powder metallurgy manufacturing method whereby a powder composition is pressurized preferably in a graphite die between e.g. two graphite punches under vacuum and a DC-current or optionally a pulsed DC-current is at the same time applied between the two punches to assist the forming process of the workpiece, in this case of the target, to be manufactured. Thereby the DC-current or pulsed DC current directly passes through the graphite die, as well as the powder compact, in case of conductive samples like superalloys. Therefore, the heat generation is internal, in contrast to the conventional hot pressing, where the heat is provided by external heating elements. This results in achieving near theoretical density at lower sintering temperature compared to conventional sintering techniques and facilitates a very high heating or cooling rate (up to 1000 K/min), hence the sintering process generally is very fast (within a few minutes). The general speed of the process ensures it has the potential of densifying powders with nanosize or nanostructure while avoiding coarsening which accompanies standard densification routes. As an example, for such a procedure a series of 3 ms dc current pulses with the strength up to 1500 A and low voltage of 25 V can be directly pass the powdered sample and the pressing tool.

The research for materials utilized at high temperature and in oxidizing and corroding environments has been an ongoing effort for applications in aircraft, gas turbine and combustion engines. Despite the different final utilization and the difference in design and dimensions, the trend in these industries is going towards the same goal, which is a continuous improvement of engine efficiency to reduce fuel consumption but also to comply with more strict regulations concerning $CO_2$ emission. This implies running the engine at higher temperatures, thus increasing consequently the need for more robust, stable and resistant base materials operated in harsh environment at different sections of a turbine engine. Even with the use of the most advanced materials such as superalloys or composites, coating technologies cannot be by-passed when it comes to improving the lifetime of the components by increasing the resistance to oxidation, wear, erosion and corrosion at high operating temperatures. Despite the fact, that the coating technologies introduced many decades ago are well established and continuously being improved through the use of new processes and new coating materials, the coating systems produced on engine components require increased complexity. Therefore, the interactions e.g. between layers, the methods for surface preparation, heat treatments and diffusion issues become increasingly important. Moreover, the requirements of the next generation engines are quite challenging for these existing technologies due to their limitations and inability to provide the required properties. Typical coating systems in gas turbines are made of several layers, generally consisting of a bond coat, a thermally grown oxide and a top ceramic layer. Bond coats, which are used to protect the turbine against oxidation, are typically produced either by diffusion processes for PtAl, electron beam physical vapour deposition (EB-PVD) or low-pressure plasma spraying (LPPS) for MCrAlY. The bond coat PLANSEE and the top ceramic layer form the so so-called thermal barrier coating (TBC). The top ceramic coating is produced by atmospheric plasma spraying (APS) as a porous coating or EB-PVD as a columnar structured coating. The design of the bond coat is challenging because it has to realize two sophisticated interfaces: the one to the superalloy substrate to guarantee mechanical stability for a wide temperature range, and the other one to the porous oxide providing an excellent oxygen barrier. This implies not only an intelligent design of the bond coat, but it also requires high reproducibility in the fabrication of the coating system (layer stack).

DISCLOSURE AND EXAMPLES

Therefore, it is an aim of the present invention to improve and simplify known coating processes for superalloys by avoiding drawbacks of state of the art methods which are e.g. use of expensive coating materials like PtAl and processes like EB-PVD which are complicated and difficult to handle if coatings consisting of elements with different vapor pressures have to be applied. A further aim of the present invention is to improve existing coatings in terms of over-all performance, e.g. to overcome limitations and inability of state of the art coating systems.

It is therefore an object of the present invention to disclose a coating method comprising the following steps:
provided a superalloy (SA) substrate in a PVD-coating unit;

providing a superalloy (SA) target as a cathode of an arc evaporation source of the coating unit;

providing a substrate bias to the substrate;

depositing an interface layer (IF-1) of superalloy on a surface of the substrate by vacuum arc deposition from the superalloy target;

providing a supply for reactive gas containing oxygen to the coating unit;

depositing a transition layer (TL) of the same superalloy or a different metal composition by vacuum arc deposition whereby oxygen content of the layer is varied from (IF-1) towards the surface by changing a partial pressure of the reactive gas in the process atmosphere, e.g. by increasing the oxygen content of the layer from (IF-1) towards the surface by rising and/or varying the partial pressure of the reactive gas;

depositing a barrier layer (IF-2) comprising a higher amount of super alloy oxides or of a different metal oxides composition than within the transition layer subsequent to the transition layer by vacuum arc deposition in a process atmosphere containing reactive gas in a higher concentration as with the deposition of the transition layer (TL).

Any change of the oxygen content within the transition layer can be performed by increasing/varying the flow of the oxygen containing reactive gas step-wise or ramp-wise and/or by varying the power of the arc source. Usually oxygen ($O_2$) gas will be used as reactive gas, however any other volatile oxygen containing compound like ozone ($O_3$) or else might be used.

Such coating process can be performed by using a superalloy target having essentially the same composition as the superalloy. Thereby the powder composition for the target production is selected according to the composition of the superalloy to be coated to produce a target of essentially the same composition as the superalloy itself. Essentially the same composition in this case means for the target, as produced by SPS or any other powder metallurgical method, that due to manufacturing and/or e.g. EDX-measurement effects main elements, constituting a weight percentage of about 9% or more of the powder mixture, like Ni, Co and Cr with PWA1483 as an example, do not differ more than ±20%, preferably not more than ±10% with reference to the original powder composition. Similar applies to targets used with reactive or non-reactive processes whereby differences to the original powder composition may be slightly higher for single main components. The same applies to the meaning of the term essentially the same composition with the composition of the interface layer (IF-1). Amongst others Ni-, Al-, C-, Co-, Cr-, Mo-, Ta-, Ti-, and W-powders were used to produce targets for cathodic vacuum arc coating as described below.

Alternatively, suitable powder could be produced also by pulverizing a superalloy solid body and then form a target by SPS or another powder metallurgical method.

In the most basic process, the same superalloy target(s) is used to deposit all layers of the bond coat and oxygen is used as process gas only.

It has been further proved to be beneficial in terms of process stability, e.g. due to a lower formation of droplets and building a perfectly fitting IF-1 layer, e.g. with reference to crystallographic coherence and epitaxy to the substrate, to provide a target with predominantly the same crystal structure, which means for Ni- or Co-based superalloys an fcc crystal target structure of about 80 to 99%.

In a further embodiment of the invention at least one further target having a further metal composition is provided to deposit the transition layer of a different metal composition and/or the barrier layer (IF-2) of a different metal oxide composition. This can be done by providing additional elemental or composite targets to the coating unit. This can be done either by co-arcing with the superalloy target and/or by stand-alone arcing of at least one of a target of further metal composition, whereby a transition phase where both types of targets are used to deposit the respective coating is preferred. Thereby the composition of a target of further metal composition has been chosen such that layers of different metal composition and/or of different metal oxide composition could be deposited either alone from the target of further metal composition or by co-arcing with the superalloy target. Alternatively, or even in combination with the use of the as mentioned target of further metal composition a gaseous precursor, comprising a further metal to be deposited, can be introduced into the PVD coating unit in parallel with vacuum arc deposition of the superalloy target, to deposit the transition layer of different metal composition and/or the barrier layer (IF-2) of different metal oxide composition. Such precursors can be introduced into the coating unit by using the supply line for inert- or reactive gas or by a separate line.

Despite of the fact that usually the ratio of at least the main metal components within the transition layer and the main metal components within IF-2 will be about the same, it should be mentioned that the ratio of any metal could be varied between or even within the respective layers step-wise or ramp-wise by e.g. co-arcing of two or more targets of different metal composition and changing the respective power input of one or both targets or by varying the flow of one or more gaseous precursors or by applying a mix of as mentioned methods respectively. Such variation of the metal content can be applied especially when forming the oxide with oxidation barrier properties, which is in standard TBC design formed by high temperature oxidation of a high aluminum containing surface before porous oxide deposition. It is one of the goals of the here described new PVD bond coat design, to replace the high temperature oxidation by the oxide formation in the PVD in-situ process.

In a further embodiment of the invention the interface layer (IF-1) is deposited with a crystal structure which is coherent with the crystal structure of the superalloy substrate. Thereby even epitaxial growth structures which mirror the crystal structure of the respective surface location of the superalloy SA could be deposited. Such coherent and especially epitaxial grown crystal structures applied to polycrystalline, directional solidified (DS) or single crystalline (SX) SA-surfaces have been proven to give excellent properties of the overall coating in terms of oxidation resistance and adhesion.

Preferably super alloy oxides and/or oxides of the different metal composition of the barrier layer (IF-2) are deposited with an oxygen surplus in the reactive gas atmosphere. The ratio of oxygen atoms to metal atoms (=surplus) can be at least 1.5, or even at least 5 to form thermodynamically stable oxides, especially the most stable oxides, from the superalloy metals and/or the different metals composition evaporated while depositing the barrier layer (IF-2). Thereby a barrier layer can be formed comprising essentially stochiometric oxides, especially in thermodynamically most stable phases for most or even for all metal elements and/or alloys of the superalloy or the different metal composition. Such barrier layers (IF-2) show a dense columnar structure, very different from e.g. the polycrystalline structure of nearly random grain orientation of an interface layer (IF-1) deposited on the surface of a polycrystalline SA.

Contrary to the barrier layer, the interface layer can be deposited in pure metallic vapor without any process gas. Alternatively, an inert gas supply can be provided to the coating unit to deposit at least one of the interface layer (IF-1), the transition layer and the barrier layer (IF-2) in an inert gas containing process atmosphere.

With reference of essential coating parameters like process pressure, arc current and substrate bias the following should be mentioned.

Process pressure ranges used to deposit the interface (IF-1) were between 0.1 mPa to 100 mPa if no inert gas was used. With the addition of inert gas, the pressure was augmented for about 0.1 Pa to 5 Pa. Further process parameters for the interface layer where:

Arc Current with the superalloy target: from 80 A to 250 A;

Substrate bias: from −20 V to −800 V DC and bipolar pulsed bias

Process pressure ranges used to deposit the transition layer (TL) in oxygen reactive gas were between 0.1 Pa to 5 Pa with and without addition of inert gas. Usually process pressure during deposition of the transition layer has been increased from the very low process pressure without any reactive gas used to deposit the interface (IF-1, see above) to the process pressure to deposit the barrier layer (IF-2) with a high amount of reactive gas (see below).

Further process parameters for the transition layer where:

Arc Current with the superalloy target: from 80 A to 200 A;

Arc Current with a target of further metal composition: from 60 A to 200 A;

Substrate bias: from −20 V to −800 DC, as well as unipolar and bipolar pulsed.

Process pressure ranges used to deposit the barrier layer (IF-2) where between 0.1 Pa and 8 Pa if no inert gas was used. With the addition of inert gas, the pressure was augmented for about 0.2 Pa to 10 Pa. Further process parameters for the interface layer where:

Arc Current with the superalloy target: from 60 A to 200 A;

Arc Current with a target of further metal composition: from 60 A to 220 A;

Substrate bias: from −20 V to −600 V DC, preferentially unipolar or bipolar pulsed.

Compositions of targets of further metal composition have been chosen such that layers of different metal composition and/or of different metal oxide composition could be deposited either alone from at least one target of further metal composition or by co-arcing with at least one superalloy target. Alternatively, or additionally precursors could be used containing at least one of the further metals to be deposited in the transition and/or barrier layer.

It has been proved to be beneficial for the present method to use superalloy targets which have been produced by a powder metallurgically process. Examples of such processes are hot pressing, hot isostatic pressing (HIP) and especially spark plasma sintering (SPS).

In a further embodiment of the present invention a further preferably porous ceramic top layer is applied to the surface of the barrier layer (IF-2) in a further process step.

Such a top layer can be applied by thermal spray technology, e.g. such as detonation spraying, wire arc spraying, flame spraying, high velocity oxy-fuel coating spraying (HVOF), high velocity air fuel (HVAF), warm spraying, cold spraying and preferably plasma spray or vacuum plasma spray.

The present invention also has the object to provide a method to produce a coated superalloy workpiece comprising a coating method as described above. Such workpieces may be e.g. any parts used in the high temperature area of industrial gas turbines or aircraft engines like turbine blades, vanes or similar.

A further object of the present invention is it to provide a superalloy workpiece comprising:

a superalloy substrate an interface layer (IF-1) of essentially the same superalloy composition directly on a surface of the superalloy substrate, followed by a transition layer (TL) of essentially the same superalloy and superalloy oxides or a different metal composition and different metal oxides whereby oxygen content of the transition layer is increasing from IF-1 towards a barrier layer (IF-2) of super alloy oxides or of different metal oxides.

Thereby IF-1 can have a crystal structure coherent or even epitaxial to the crystal structure of the surface of the superalloy substrate.

The oxygen content in the transition layer can increase stepwise or gradually from IF-1 to IF-2.

The different metal composition in the transition layer can differ from essentially the same superalloy composition by at least one further element. As well can differ the metal composition of the different metal oxides of the barrier layer by at least one further metal, which will there be existent in form of an oxide.

The at least one further element can have an electronegativity according to Pauling of equal or smaller 1.4. Such low electronegativity is typically for metals having a high potential to bind oxygen, e.g. when such metals are dispersed in a matrix of solid state metals having less tendency to form oxides. Such a further element can be a Lanthanide, preferably at least one of La, Er, or Yb. Alternatively, the different metal composition can differ from the superalloy composition by the concentration of at least one element or by the concentration and/or the addition of at least one of the following further elements: Mg, Al, Cr, Er, Y, Zr, La, Hf, Si.

At least a part of the further elements can be oxidized and deposited as solid solution (SS) within the crystal grains and/or along grain-boundaries of the transition layer (TL) and/or the barrier layer (IF-2) as dispersion strengthened oxide (ODS).

Such metals of low electronegativity, like alkaline metals, alkaline earth metals, Lanthanides, Actinides and some metals of the $3^{rd}$ and $4^{th}$ group (transition metals) of the periodic system of the elements, are known to be prone to form solid solutions (SS) within the crystal grains of the solid main matrix or to form oxide dispersion strengthened (ODS) solid bodies when such metals are located along grain-boundaries of a polycrystalline solid and oxidized by diffusing oxygen atoms. Use of such thermodynamically stable materials (SS and/or ODS) is known from oxide dispersion hardening processes to strengthen such alloys, e.g. superalloys, by addition of only a small amount of such oxide forming elements (about 2 vol %). However, it is the first time that a similar effect could be proven with coatings when coatings according to the present invention have been deposited. The effect of SS and/or ODS strengthening with partially oxidized superalloys in the transition layer could be shown.

The concentration of at least one of the metallic elements or silicon in the transition layer can be modulated or increased stepwise or gradually from IF-1 to IF-2.

The different metal oxides may comprise at least one of the following oxides or a mixture thereof:

aluminumoxide, aluminium-chromiumoxid, Erbiumoxid, yttriumoxide, yttrium-aluminiumoxide, magnesium-aluminiumoxide, aluminium-siliciumoxide, hafnium-siliciumoxide.

Thereby aluminumoxide or aluminium-chromiumoxid can be $Al_2O_3$ or $(AlCr)_2O_3$ comprising a corundum crystal structure whereas erbiumoxid or yttriumoxide, can be $Er_2O_3$ or $Y_2O_3$ comprising a cubic crystal structure and more than 55%, preferably more than 75% of the respective crystal structure can be respective corundum or cubic crystal structure.

The different metal oxides may comprise an aluminium-containing oxide and TL and/or IF-2 layer may comprise aluminium-droplets or droplets having a high content of metallic aluminium.

In case of oxides comprising aluminium-chromiumoxid, e.g. in corrundum structure and/or dispersed as SS or ODS in the transition and/or barrier layer, the layers may also comprise droplets having a high content of metallic chromium.

As an example, for use with IGT and aero applications, a ceramic top layer may be provided as terminal layer on the surface of the barrier layer (IF-2) on top of the bond coat. Such a top layer can be made with a porous structure to better adapt the thermal expansion with high temperature applications.

With reference to the bond coat consisting of consecutive
interface layer (IF-1)
transition layer (TL) and
barrier layer (IF-2)
the following over all coating thickness can be chosen:

$$1 \ \mu m \leq d_{bond} \leq 200 \ \mu m$$

With layerthickness of the interface layer (IF-1):

$$0.01 \ \mu m \leq d_{IF-1} \leq 20 \ \mu m$$

With layerthickness of the transition layer (TL):

$$0.1 \ \mu m \leq d_{TL} \leq 100 \ \mu m$$

With layerthickness of the barrier layer (IF-2):

$$1 \ \mu m \leq d_{IF-2} \leq 50 \ \mu m$$

The thickness of a following thermal spray ceramic top layer for aero or IGT applications has been chosen between 10 μm and 3 mm and showed an excellence adhesion and wear resistance.

In the following the invention will be further explained at the hand of examples and figures. It should be mentioned that any combination of any embodiments, modifications or examples of the present invention, also if not explicitly mentioned in the present description or claims is supposed to be part of the invention as far it cannot be immediately recognized to be dysfunctional for the man of the art.

BRIEF DESCRIPTION OF THE DRAWINGS

In the following the invention is described in an exemplary way with the help of experimental details and figures.
FIGS. 1 to 9 show the following:
FIG. 1 Layer concept and example of a bond coat;
FIG. 2 XRD pattern of a virgin and an operated target;
FIG. 7 XRD analog to FIG. 2 on sapphire
FIGS. 8A-8C Layer stack: STEM bright-field, TKD, quality map;
FIG. 9 TEM micrograph interface With the present invention a layer concept is introduced which is sketched in FIG. 1a. The approach is based on the formation of a "substrate-identical" interface layer (IF-1) to the bulk superalloy substrate (SA-S) and a subsequent transition layer (graded-layer) from IF-1 to a partially or fully oxidized coating ending in a second interface layer, here also barrier layer (IF-2). This IF-2 may be an oxygen diffusion barrier and/or a nucleation layer for a porous oxide as it is utilized in the design of a TBC. It could also be an ODS coating or a mixture of oxides which are formed during the oxidation of the superalloy vapour. The whole layer stack is synthesized in one process under vacuum conditions typical for Physical Vapour Deposition (PVD). Non-reactive and reactive arc evaporation is utilized to produce this coating design by in-situ processing.

Figure 1:
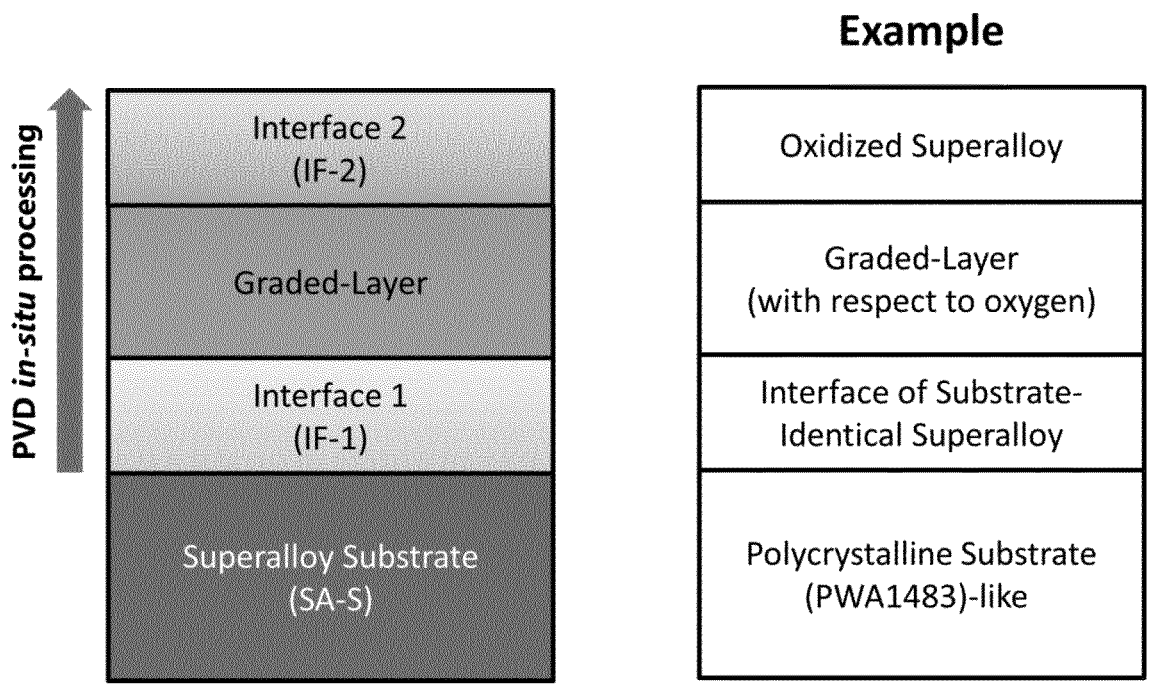

An example of a basic bond coat on a polycrystalline superalloy is shown in FIG. 1b, comprising an interface very similar or even identical to the superalloy basis, a transition layer which is graded with reference to the oxygen concentration, which means that the oxygen content increases from the interface to the barrier layer which is an oxidized superalloy according to the present example.

The substrates as well as the targets were produced from powders with the chemical composition listed in Table 1, $2^{nd}$ column. This composition corresponds to the specification of the superalloy PWA1483. However, the substrates as well as the targets were fabricated by spark plasma sintering at approximately 1200° C. and 30 MPa (PLANSEE Composite Materials GmbH). Therefore, it is likely that this material differs from the industrially utilized bulk material produced by melting and casting. In this regard it is important to remark that:

the average grain size in structure is smaller than 50 μm and preferably smaller than 20 μm,
the powder-metallurgical production preferably starts from alloyed powders instead from a mixture of elemental powders,
the synthesis of the phases thereby takes place during the manufacture of the powders and not during the SPS process,
such manufactured targets have no texture, i.e. they are characterized by random grain orientation (e.g. measured by EBSD), which is very different from targets manufactured by melting-metallurgy,
the porosity in structures produced by means of SPS processes is adjusted to be smaller than 10% or preferably lower than 5%,
SPS processes are conducted without involving the formation of liquid phases in temperature ranges of 1000 to 1350° C., preferably in temperature ranges of 1100 to 1300° C.

Considering this, we will further denominate this material as superalloy substrate (SA-S), if it is utilized as substrate, and superalloy target (SA-T), if it is used as target for the evaporation. Small discs (Ø 60 mm) were produced from this material and machined to the size of (30 mm×10 mm×5 mm) for the SA-S. In identical processes, the SA-T discs (Ø 150 mm) were fabricated.

Table 2 lists the main process parameters utilized in the cathodic arc evaporation using the SA-T as cathodes in the examples discussed in the following. Before deposition, the process chamber was evacuated below 0.02 Pa and standard heating and etching steps were performed to ensure a sufficient coating adhesion to the substrate. A net deposition time of 45 min was chosen for the non-reactive process (metallic vapour only) and was increased to 240 min for the reactive processes in oxygen. This is due to the reduced evaporation rate of the SA-T in pure oxygen reactive gas, resulting in coating thicknesses of 1.5 µm (reactive) and 2.2 µm (non-reactive), respectively. The cathodes were operated with DC arc currents of 140 A, either in metallic vapour only, or with a gas flow of 800 sccm oxygen (reactive processes) using an INNOVA batch-type production system of Oerlikon Surface Solutions AG. SA-S together with sapphire substrates were coated at substrate temperatures of approximately 550° C. Only one arc source was utilized for deposition. A symmetric bipolar bias voltage of 40 V with a frequency of 25 kHz and a negative pulse length of 36 µs and 4 µs positive pulse length was applied to the substrate during processing in oxygen.

The target surface was analyzed in a LEO 1530 scanning electron microscope (SEM). The chemical compositions of the SA-T and SA-S were measured by energy-dispersive X-ray spectroscopy (EDX) in the SEM.

XRD measurements on polished slices of the polycrystalline target material were performed on a Bruker D8 Davinci diffractometer equipped with a Göbel mirror for the generation of a parallel beam and with a LynxEye 1D detector using Cu—Kα radiation. The measurements were carried out in 2θ/ω mode between 5-140°. For phase analysis, the software Diffrac.Eva V4.1 from Bruker was used in combination with the crystal open database (COD), an open-access collection of crystal structures published in the Journal of Applied Crystallography 42 (2009) 726-729.

Conventional electron backscatter diffraction (EBSD) analyses were performed on the SA-T surfaces in a dual FIB FEG-SEM Lyra3 from Tescan, using a Digiview IV EDAX camera. An acceleration voltage of 20 kV and an emission current of 5 nA were used. Furthermore, Transmission-EBSD or Transmission Kikuchi Diffraction (TKD) was done on lift-out specimens of about 100 nm thickness, mounted on a holder with a pre-tilt angle of 20° to the pole piece with 3 mm working distance. Beam conditions were 30 kV and 5 nA. The chemical segregation was analysed by means of ion channeling contrast imaging which was performed using 30 kV and 1.5 pA Ga ions. The lift-out lamellae were finally analysed by transmission electron microscopy (TEM) in a JEOL JEM 2200fs equipped with an EDAX EDS system.

Analysis of Virgin Target (Cathode)

The chemical composition of the SA-T manufactured by spark plasma sintering was investigated by EDX. Due to the large number of elements to be analyzed and their different sensitivity for this method, a quantitative analysis is difficult. However, the similarity in the materials allow (apart from C) a qualitative comparison. Table 1 shows the results for the as manufactured virgin surface of the manufactured target with numbers in relation to the total element composition in $3^{rd}$ and difference (Δ) numbers to the powder composition in the $4^{th}$ column. Except for carbon and tantalum, there is a fair agreement in composition with the original powder. The crystal structure of the virgin target surface obtained by XRD analysis was compared with the target surface after arc operation in non-reactive processes. The 2θ/ω scans are shown in FIG. 2.

The XRD pattern of a virgin target (dotted line) shows several main peaks which can be indexed as fcc cubic (Fm-3m) with a=3.59 Å. The diffraction pattern which is observed for various elements from which the superalloy is composed of (Table 1) matches this cubic lattice. In addition to the individual elements, a multitude of different intermetallic compounds like $Cr_2Ni_3$, $Al_{2.6}Ni_{10.7}Ta_{0.7}$, $Ni_{0.9}Ta_{0.1}$, $Ni_{17}W_3$, $Co_{0.87}W_{0.13}$, $Ni_{3.28}Ti_{0.72}$, $Ni_{0.85}W_{0.15}$ or CrNi can be indexed and may be considered as potential candidates for the observed fcc phase. Peaks with intensities below 1% are also visible in the XRD pattern of the virgin target surface. They may belong to the XRD pattern of tantalum oxide phases which form as a result of surface oxidation. Peaks of the XRD pattern revealed for the operated target (continuous line) a similar fcc cubic (Fm-3m) phase as observed for the virgin target surface. The peaks of the operated target are however slightly shifted towards higher angles indicating a decrease of the unit cell parameter a from 3.59 Å for the virgin target to 3.58 Å for the operated target. At the same time the peaks of the operated target are narrower than those of the virgin target which may be due to recrystallization processes on the target surface and consequently the formation of larger crystallites. The supposition of the presence of different intermetallic compounds from the X-ray diffraction analysis is in agreement with the results of the TEM measurements. They confirm that these superalloy materials are indeed composed of different intermetallic compounds (see below).

Figure 3A:
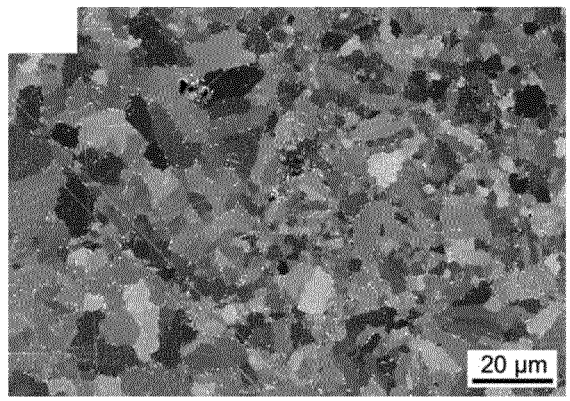
FIGS. 3A-3B Micrograph and EBSD of the SA-T surface.
Figure 3B:
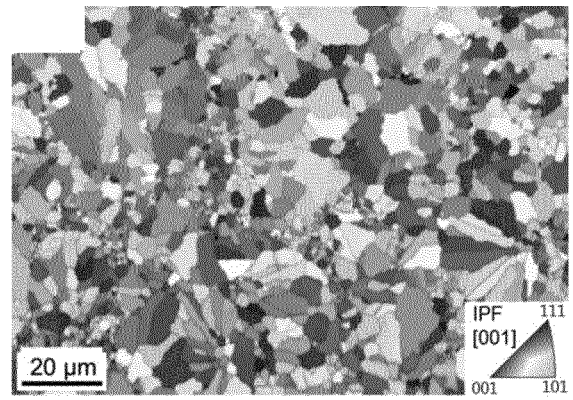
Figure 4A:
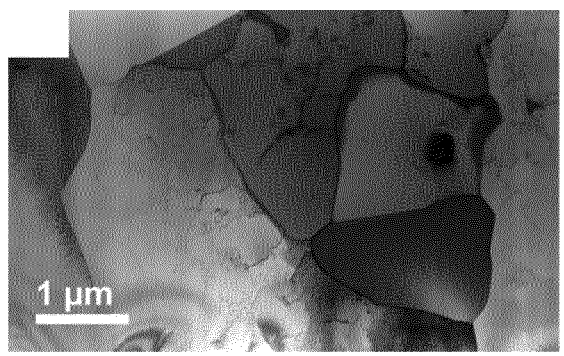
FIGS. 4A-4B TEM images of the SA-T surface.
Figure 4B:
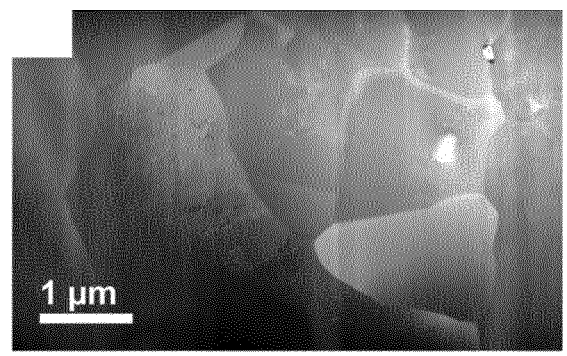
Figure 5A:
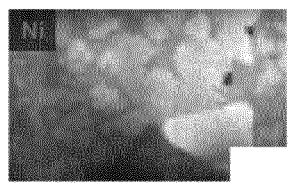
FIGS. 5A-5H EDX mapping
FIGS. 6A-6C Bright- and dark-field micrographs, line scan.
Figure 5B:
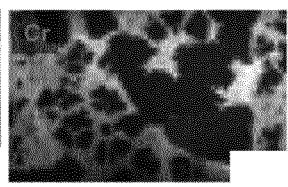
Figure 5C:
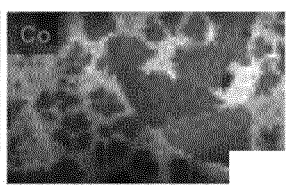
Figure 5D:
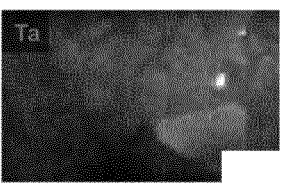
Figure 5E:
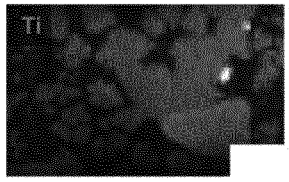
Figure 5F:
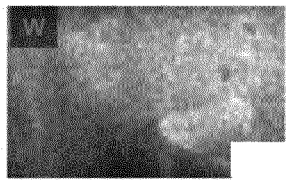
Figure 5G:
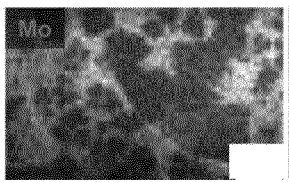
Figure 5H:
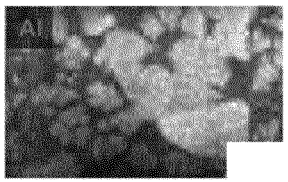

A micrograph of the SA-T surface obtained from SEM with backscattered electrons using 20 kV beam voltage is displayed in FIG. 3a. The contrast in the backscattered image is mainly due to grain orientation. This was verified by a corresponding EBSD crystal orientation map of the investigated surface which is shown in a black and white (bw) version with FIG. 3b. The EBSD analysis indicates 88% high angle and 12% low angle grain boundaries and 7% Σ3 twin (60°@(111)) boundaries with an average grain size of (5.9±3.1) µm. The white spots in the observed backscattered image of FIG. 3a were identified in the TEM as precipitates rich in titanium and tantalum. An enlarged section with different grains is shown in the bright-field and dark-field scanning transmission electron microscopy images in FIGS. 4a and b, respectively. An EDX mapping of this detail is given in FIG. 5. This mapping indicates that Cr (sub-FIG. 5b), Co (FIG. 5c) and Mo (FIG. 5g) are segregating together, also within the grains. The same holds for Ni (FIG. 5a), Al (FIG. 5h), Ti (FIG. 5e) and Ta (FIG. 5d). In addition, the mapping suggests that the precipitates consist mainly of Ta and Ti.

Figure 2:
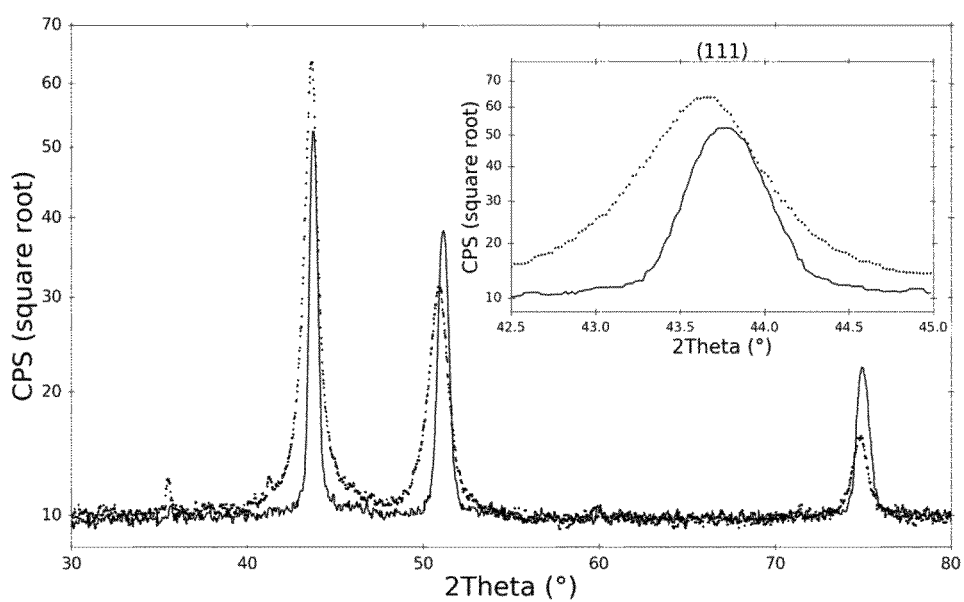
Figure 6A:
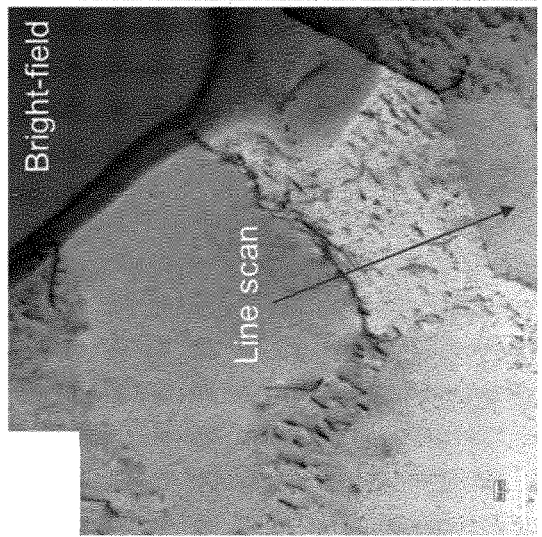
Figure 6B:
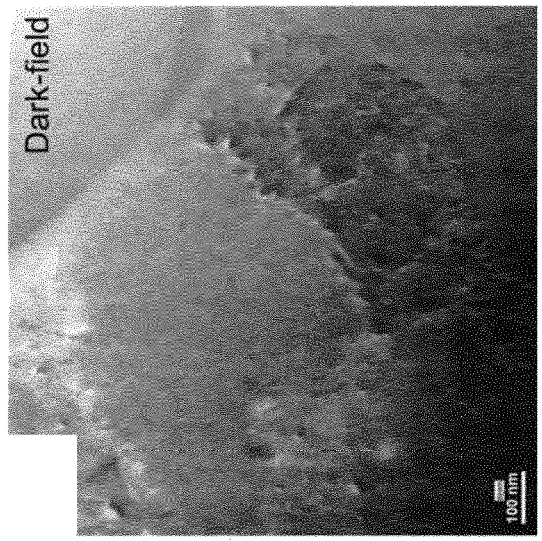
Figure 6C:
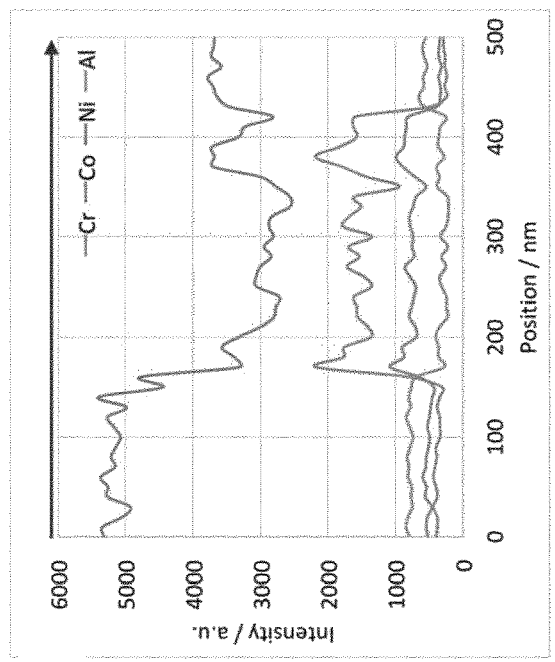

As mentioned earlier, the XRD pattern obtained from the surface of as manufactured and operated targets can be indexed with fcc phases for which different intermetallic compounds may be potential candidates (FIG. 2). This assumption is supported by STEM investigations, where chemical segregation was observed within and between the grains. FIG. 6 shows as examples bright-field (6a) and dark-field (6b) micrographs for the transitions across two grain boundaries. The arrow in FIG. 6a indicates the position for which the EDX line scan shown in FIG. 6c was performed. The qualitative distribution of only the predominant elements is plotted and it changes significantly between the two investigated grains. Segregation of Ni/Al and Co/Cr is observable, which is in good agreement with the mapping shown in FIG. 5. This was the case for many similar line scans, which indicate the presence of more than one fcc phase with very similar lattice constants.

The analysis of the target indicates that the spark plasma sintering process produces a target material with polycrystalline structure of nearly random grain orientation. In addition, the analysis proves the presence of different intermetallic phases with similar lattice constants and the existence of precipitates in the produced material.

Analysis of Operated Targets

In a next step, the as manufactured targets were utilized as cathodes and evaporated by arc. The evaporation was performed under the conditions mentioned in Table 2. In the non-reactive process, no additional gases were utilized during evaporation. This approach relinquishes of the possible reduced incorporation of droplets in the deposited coatings due to multiple scattering with gas atoms, however, it allows to maintain the higher degree of ionization and the higher kinetic energy of the metallic vapour supporting coating condensation at higher energy. The reactive process was performed in oxygen only. The value of oxygen flow was chosen to ensure an oxygen to evaporated metal atom ratio of about 4 to 5 to produce the IF-2 (oxidized super alloy layer) which should result in a nearly full oxidation of the coating. The chemical compositions of the targets after non-reactive process A and reactive process B were measured by EDX and are given in Table 1 together with the difference ($\Delta$) to the original powder composition ($5^{th}$ to $8^{th}$ column). The analysis of the target surface indicates a slight reduction in Al and Cr from non-reactive to reactive process, but no drastic change in the composition for the other target elements. The XRD pattern of the target surface after arc operation in non-reactive mode is given in FIG. 2 (continuous line). Compared with the virgin target (dotted line), peaks of the operated target are narrower and shifted towards higher angles. They can as well be assigned to a fcc cubic phase (Fm-3m). The average unit cell of the operated target is slightly smaller, and the lattice parameter decreases from 3.584 Å (before operation) to 3.568 Å (after operation) and the reduced full width at half maximum (FWHM) indicates recrystallization processes on the target surface.

Coating Synthesis

Coatings were synthesized with the parameters of process A given in Table 2 by non-reactive processing to investigate if the chemical composition of the target can also be maintained in the coating. The composition obtained by EDX is displayed in Table 3, in both cases coating A has the composition of the interface layer (IF-1). Except for C, for which EDX is not sensitive and accurate enough, the analysis indicates only for Al concentration and, to some extent, for Ti concentration a reduction in the coating. Initial XRD analysis of the coatings on the SA-S substrate was performed. As coating and SA-S have very similar lattice constants, the observed Bragg reflections could not be assigned unambiguously to the coating. Therefore, the measurements have been repeated for coatings on sapphire substrates (FIG. 7).

Figure 7:
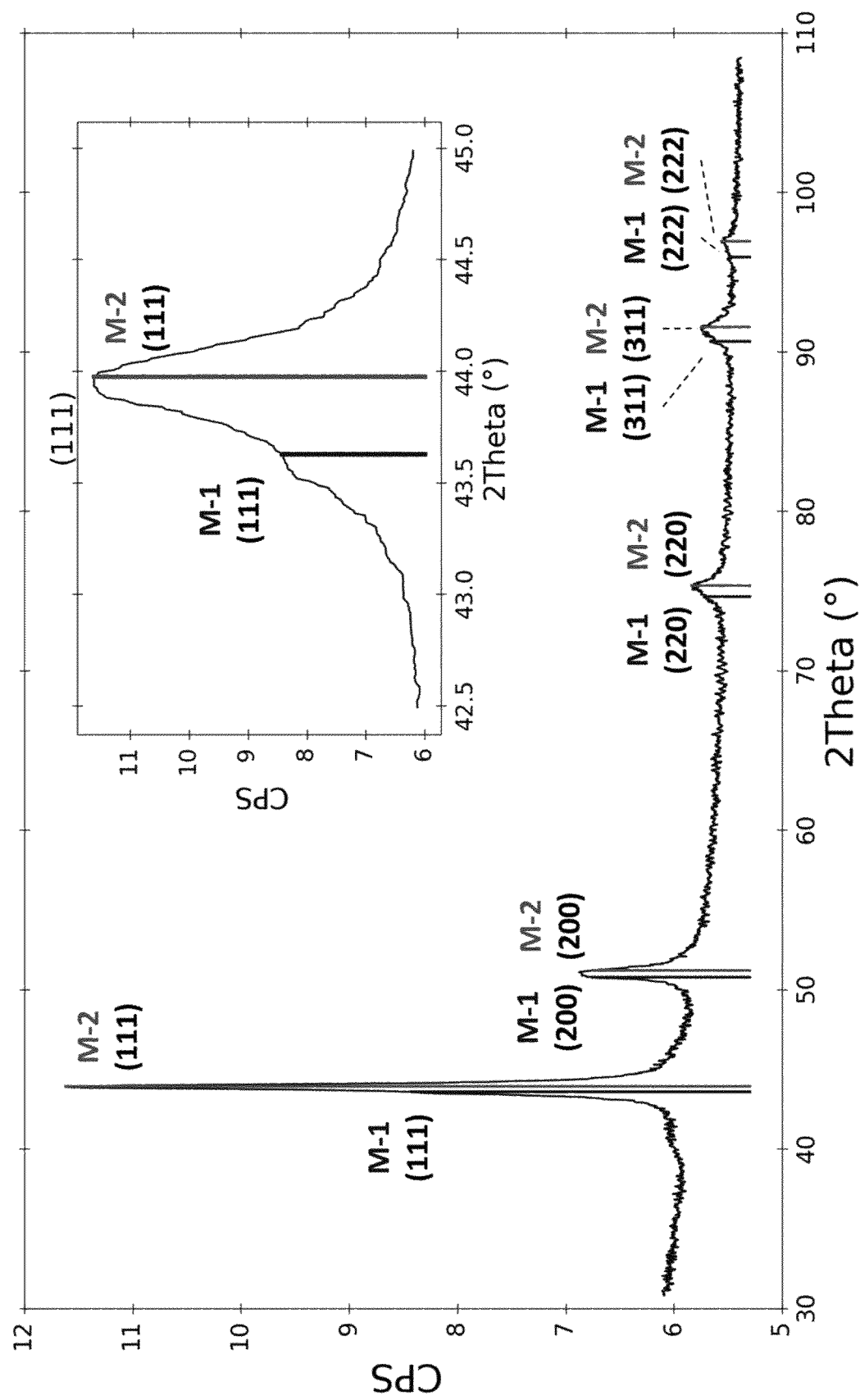

The first of the two observed phases, denoted as M-1 with a=3.60 Å, (black lines, left side of the peaks), is nearly identical with the phase of the uncoated SA-S (a=3.59 Å) (FIG. 7). Reflections of the second phase M-2 (grey lines, right side of the peaks), are shifted towards higher 2θ angles (a=3.56 Å). This indicates that the nucleation behaviour on the sapphire substrate is slightly different. The lattice constant of the phase M-2 has been determined to be approximately 3.56 Å. The TEM investigations of the target (and substrate) material already indicated more than one intermetallic phase and EDX mapping showed that there are at least two groups of elements in addition to precipitates which are segregating together. It is likely that these two groups condensate at different temperatures which results in this phase separation.

Figure 9:
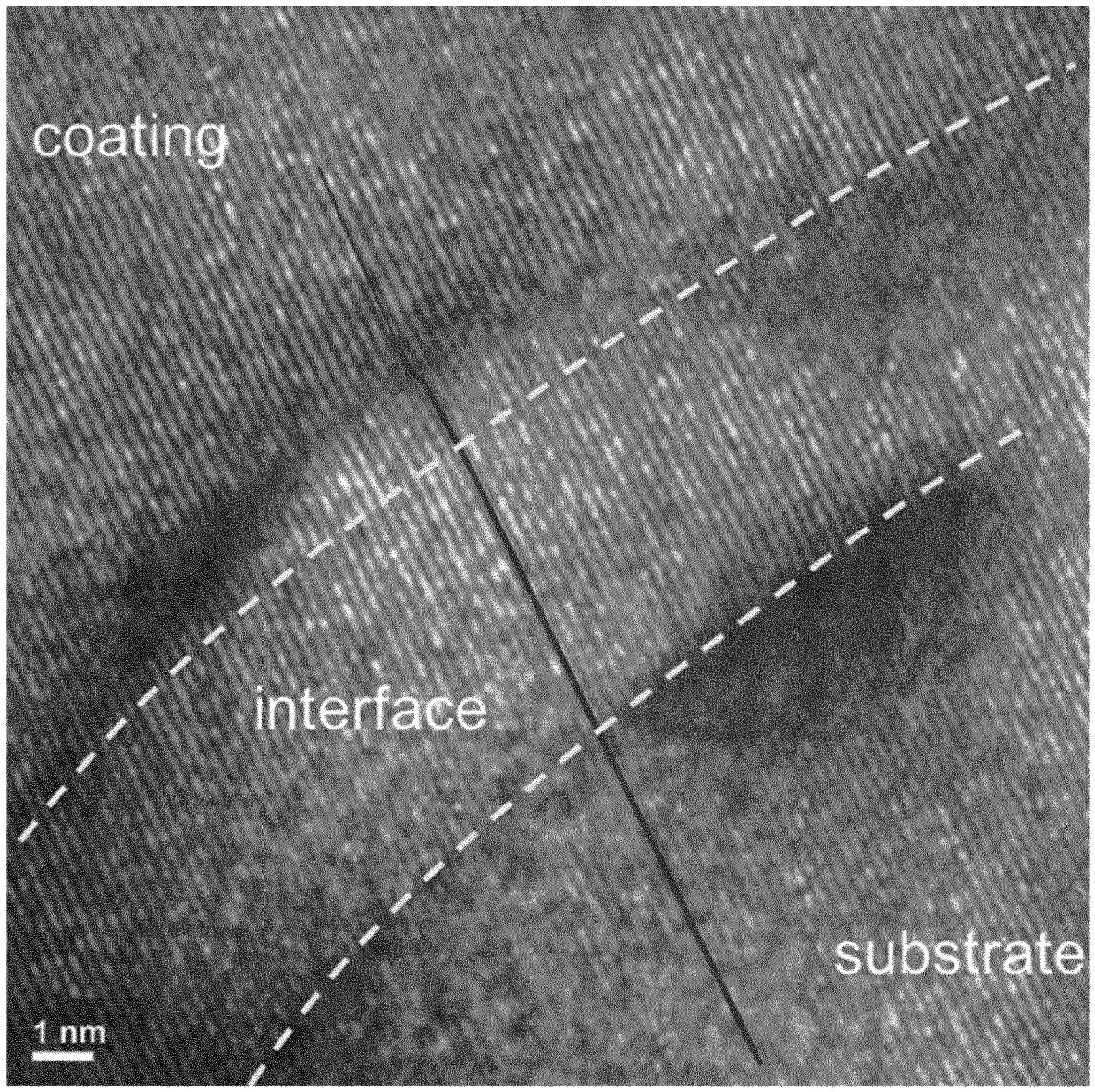

In additional experiments, a complete stack of layers was investigated according to process B. After initial pre-treatment of the SA-S as described above, the IF-1 was formed by arc evaporation in non-reactive mode and without additional interfaces at the SA-S with a thickness of about 500 nm. In subsequent steps, 800 sccm oxygen was fed to the arc evaporation process and a short transition from the non-reactive to the reactive mode was performed. Together with the double rotation of the substrate, this results in a multi-layer structure and finally in the nucleation of an oxide coating of about 1.5 μm. A STEM bright-field image of the complete layer stack is shown in FIG. 8a. The interface between the substrate and the interface layer IF-1 is indicated by a dashed line in FIGS. 8b and c. The interface has been investigated in greater detail by TKD in FIG. 8c and a corresponding image quality map in FIG. 8b, here in black and white. Orientation mapping indicated epitaxial growth at grains in the region of IF-1 followed by the nucleation of many and very small grains with arbitrary orientation and finally the growth of larger grains nucleating at the finer grains of this transition region and forming the oxidized region of the layer stack. A high resolution (HR)-TEM micrograph of an enlarged region of the interface is given in FIG. 9. The micrograph demonstrates that the lattice planes of the ST-A and the coating are parallel with the same distance between the planes confirming once more the epitaxial growth of the coating on the substrate.

Thereby it is shown in detail the possibility to create a complete layer stack for a bond coat by cathodic arc evaporation in an in-situ process sequence, i.e. without interruption of vacuum. It was demonstrated that targets from powders nearly identical in chemical composition with a superalloy substrate can be fabricated and utilized as cathodes in arc evaporation. The targets can be operated in non-reactive and reactive deposition processes. The investigation of the target surface after processing with and without oxygen reactive gas, revealed only little influence on chemical composition and crystal structure. Coatings synthesized in non-reactive deposition mode are also similar in chemical compositions and crystal structure with respect to the targets. The approach to create a complete layer stack for the bond coat in one process, allows a design principle of grading profiles either by the controlled addition of the reactive oxygen gas or by the operation of additional targets with the same or different elemental compositions. In addition, epitaxial growth could be observed at the grains of the polycrystalline substrate at the substrate interface. The addition of oxygen to the running arc evaporation process results in a fine-grained transition region and finally a nucleation of larger crystallites in the fully oxidized region of the layer stack. The presented approach has the potential to realize epitaxial growth at arbitrary superalloy materials and to perform gradients to coatings with different chemical composition and functionality.

TABLE 1

| Element | Powder Composition as produced [wt. %] | Target Composition (Δ % refers to powder composition) | | | | | |
|---|---|---|---|---|---|---|---|
| | | Process A [wt. %] | [Δ %] | Process B [wt. %] | [Δ %] | [wt. %] | [Δ %] |
| C | 0.07 | 0.9 | >10³ | 0.5 | 614 | 0.4 | 471 |
| Al | 3.6 | 3.8 | 5.6 | 3.1 | −13.9 | 1.6 | −55.6 |
| Ta | 5 | 8.2 | 64.0 | 5.2 | 4.0 | 4.6 | −8.0 |
| W | 3.8 | 4.5 | 18.4 | 3.6 | −5.3 | 4.6 | 21.1 |
| Mo | 1.9 | 2 | 5.3 | 1.2 | −36.8 | 1.6 | −15.8 |
| Ti | 4.1 | 3.8 | −7.3 | 2.9 | −29.3 | 2.2 | −46.3 |
| Cr | 12.2 | 11.2 | −8.2 | 14.2 | 16.4 | 11.8 | −3.3 |
| Co | 9 | 8.5 | −5.6 | 8.9 | −1.1 | 9.6 | 6.7 |
| Ni | 60.33 | 57.1 | −5.4 | 60.3 | 0.0 | 63.6 | 5.4 |

TABLE 2

| Process Coating | Arc Current [A] | Oxygen Flow [sccm] | Deposition Time [min] | Substrate Bias [V] | Interface |
|---|---|---|---|---|---|
| A | 140 | 0 | 45 | −40 | none |
| B | 140 | 800 | 240 | −40 | 1. Coating A (500 nm) 2. Transition in oxygen from 0 to 800 sccm within 200 nm |

TABLE 3

| | Powder Composition | Composition Coating A EDX | |
|---|---|---|---|
| Element | [wt. %] | [wt. %] | [Δ %] |
| C | 0.07 | 0.5 | 614.3 |
| Al | 3.6 | 1.2 | −66.7 |
| Ta | 5 | 6.4 | 28.0 |
| W | 3.8 | 4.2 | 10.5 |
| Mo | 1.9 | 1.5 | −21.1 |
| Ti | 4.1 | 2.8 | −31.7 |
| Cr | 12.2 | 14 | 14.8 |
| Co | 9 | 9.3 | 3.3 |
| Ni | 60.33 | 60.1 | −0.4 |

What is claimed is:

1. A superalloy workpiece comprising
a superalloy substrate and
an interface layer (IF-1) of essentially the same superalloy composition
as the superalloy substrate directly on a surface of the superalloy substrate, followed by
a transition layer (TL) of essentially the same superalloy composition as the superalloy substrate and superalloy oxides from that superalloy composition whereby oxygen content of the transition layer is
increasing from interface layer (IF-1) towards
a barrier layer (IF-2) of super alloy oxides
wherein the interface layer (IF-1) has a crystal structure which is coherent to a crystal structure of the surface of the superalloy substrate.

2. The superalloy workpiece according to claim 1, wherein the oxygen content in the transition layer increases stepwise or gradually from the interface layer (IF-1) to the barrier layer (IF-2).

3. The superalloy workpiece according to claim 1, wherein a concentration of at least one metallic element in the transition layer increases stepwise or gradually from the interface layer (IF-1) to the barrier layer (IF-2).

4. The superalloy workpiece according to claim 1, comprising a ceramic top layer on the surface of the barrier layer (IF-2).

5. A superalloy workpiece comprising
a superalloy substrate and
an interface layer (IF-1) of essentially the same superalloy composition as the superalloy substrate directly on a surface of the superalloy substrate, followed by
a transition layer (TL) of a different metal composition and different metal oxides from the different metal composition whereby oxygen content of the transition layer is increasing from the interface layer (IF-1) towards
a barrier layer (IF-2) of the different metal oxides
wherein the different metal composition differs from essentially the same superalloy composition by at least a concentration of at least one element or an addition of at least one further element,
wherein the interface layer (IF-1) has a crystal structure which is coherent to a crystal structure of the surface of the superalloy (SA) substrate.

6. The superalloy workpiece according to claim 5 wherein the at least one further element has an electronegativity of equal to or smaller than 1.4.

7. The superalloy workpiece according to claim 5 wherein the at least one further element comprises a lanthanide.

8. The superalloy workpiece according to claim 7 wherein the lanthanide comprises at least one of La, Er, or Yb.

9. The superalloy workpiece according to claim 5, wherein when the different metal composition differs by the addition of at least one further element, the different metal composition differs from the superalloy composition by an addition of at least one of the following further elements: Mg, Al, Cr, Er, Y, Zr, La, Hf or Si.

10. The superalloy workpiece according to claim 9, wherein a concentration of at least one metallic element or silicon in the transition layer increases stepwise or gradually from the interface layer (IF-1) to the barrier layer (IF-2).

11. The superalloy workpiece according to claim 5, wherein the different metal oxides comprise at least one of the following oxides or a mixture thereof:
aluminumoxide, aluminum-chromiumoxide, erbiumoxide, yttriumoxide, yttrium-aluminumoxide, magnesium-aluminumoxide, aluminum-siliciumoxide or hafnium-siliciumoxide.

12. The superalloy workpiece according to claim 11, wherein the different metal oxides comprise at least one of the following oxides in the respectively given crystal structure or a mixture thereof: $Al_2O_3$ comprising a corundum crystal structure, $(AlCr)_2O_3$ comprising a corundum crystal structure, $Er_2O_3$ comprising a cubic crystal structure, or $Y_2O_3$ comprising a cubic crystal structure.

13. The superalloy workpiece according to claim 12, wherein more than 55% by volume of the respective crystal structure are corundum crystal structure for $Al_2O_3$ and/or $(AlCr)_2O_3$.

14. The superalloy workpiece according to claim 12, wherein more than 55% by volume of the respective crystal structure are cubic crystal structure for $Er_2O_3$ and/or $Y_2O_3$.

15. The superalloy workpiece according to claim 5, wherein the different metal oxides comprise an aluminum-containing oxide and the transition layer and/or the barrier layer comprises aluminum containing-droplets.

16. The superalloy workpiece according to claim 5, wherein the different metal oxides comprise a chromium-containing oxide and the transition layer and/or the barrier layer comprises chromium containing-droplets.

17. The superalloy workpiece according to claim 5, comprising a ceramic top layer on the surface of the barrier layer (IF-2).

* * * * *